US 7,049,641 B2

(12) United States Patent
Pan

(10) Patent No.: US 7,049,641 B2
(45) Date of Patent: May 23, 2006

(54) USE OF DEEP-LEVEL TRANSITIONS IN SEMICONDUCTOR DEVICES

(75) Inventor: Janet L. Pan, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 10/654,790

(22) Filed: Sep. 4, 2003

(65) Prior Publication Data

US 2005/0056864 A1    Mar. 17, 2005

Related U.S. Application Data

(60) Provisional application No. 60/408,488, filed on Sep. 4, 2002, provisional application No. 60/420,886, filed on Oct. 24, 2002.

(51) Int. Cl.
*H01L 31/072* (2006.01)
(52) U.S. Cl. .......................... 257/188; 257/13; 257/14; 257/15; 257/22; 257/94; 257/101; 257/103
(58) Field of Classification Search .................. 257/13, 257/14, 15, 22, 94, 101, 103
See application file for complete search history.

(56) References Cited

U.S. PATENT DOCUMENTS 5,471,067 A * 11/1995 Ikeda et al. .................. 257/14

OTHER PUBLICATIONS

J.L. Pan, J.E. McManus, L. Grober and J.M. Woodwall, Gallium-arsenide deep-level pin tunnel diode with very negative conductance, Electronics Letters, Sep. 18, 2003, vol. 39 No. 19.
Janet L. Pan, Joseph E.McManis, Thomas Osadchy, Louise Grober, Jerry M. Woodall and Peter J. Kindlmann, Gallium arsenide deep-leveloptical emitter for fibre optics, Nature Materials, Jun. 2003, pp. 375-378, ©2003 Nature Publishing Group.
Janet L. Pan, J.E. McManis, L. Grober, J.M. Woodall, Gallium-arsenide deep-level tunnel diode with record negative conductance and record peak current density, Solid-State Electronics 48, (2004), pp. 2067-2070, ©2004 Elsevier Ltd.

(Continued)

*Primary Examiner*—Mai-Huong Tran
(74) *Attorney, Agent, or Firm*—D. Garrod

(57) ABSTRACT

The invention relates to the design, fabrication, and use of semiconductor devices that employ deep-level transitions (i.e., deep-level-to-conduction-band, deep-level-to-valence-band, or deep-level-to-deep-level) to achieve useful results. A principal aspect of the invention involves devices in which electrical transport occurs through a band of deep-level states and just the conduction band (or through a deep-level band and just the valence band), but where significant current does not flow through all three bands. This means that the deep-state is not acting as a nonradiative trap, but rather as an energy band through which transport takes place. Advantageously, the deep-level energy-band may facilitate a radiative transition, acting as either the upper or lower state of an optical transition.

20 Claims, 16 Drawing Sheets

OTHER PUBLICATIONS

Janet L. Pan, Analytical method for finding the general optical properties of semiconductor deep centers, Journal of Applied Physics, Nov. 15, 2002, pp. 5991-6004, vol. 92, No. 10, ©2002 American Institute of Physics.

Janet L. Pan, Optical emission from bound states of semiconductor deep-centers, Optics Express, Dec. 17, 2001, pp. 796-801, vol. 9, No. 13, ©2001 OSA.

S. Fukushima, K. Mukai, N. Otsuka, X-ray diffraction analysis of LT-GaA's multilayer structures, Journal of Crystal Growth, 2002, pp. 1-5, ©2002 Published by Elsevier Science B.V.

G. M. Martin, M. L. Verheijke and J.A.J. Jansen, Measurement of the chromium concentration in semi-insulating GaAs using optical absorption, J. Appl. Phys. 50(1), Jan. 1979, pp. 467-471, ©1979 American Institute of Physics.

J. Serrano, A. Wysmolek, T. Ruf, M. Cardona, Spin-orbit splitting of acceptor states in Si and C, Physica B, 273-641 (1999), pp. 640-643, ©1999 Elsevier Science B.V.

C.R. Pidgeon and R.N. Brown, Interband Magneto-Absorption and Faraday Rotation in InSb, Physical Review, Jun. 10, 1966, pp. 575-583, vol. 146, No. 2.

G. Martinez, A.M. Hennel W. Szuszkiewica, and M. Balkanski, Charge transfer Cr3+(3d3) Cr2+(3d4) in chromium-doped GaAs, Physical Review B, Apr. 15, 1981, pp. 3920-3932, vol. 23, No. 8, ©1981 American Physical Society.

Peter C. Sercel, Al. L. Efros and M. Rosen, Intrinsic Gap States in Semiconductor Nanocrystals, Physical Review Letters, Sep. 20, 1999, pp. 2394-2397, vol. 83, No. 12, ©1999 The American Physical Society.

D.T.J. Hurle, Charged native point defects in GaAs and othe III-V compounds, Journal of Crystal Growth, pp. 1-7, 2002 Published by Elsevier Science B.V., ©2002 Published by Elsevier Science B.V.

J.C. Bourgoin, H. Hammadi, M. Stellmacher, J. Nagle, B. Grandidier, D. Stievenard, J.P. NYS, C. Delerue, M. Lannoo, As antisite incorporation in expitaxial growth of GaAs, Physica B 273-274, 1999, pp. 725-728, ©1999 Elsevier Science B.V.

R. L. Weiher and W.C. Tait, Application of the Quantum-Defect Method to OpticalTransitions Involving Deep Effective-Mass-Like Impurities in Semiconductors, Physical Review, Sep. 9, 1969, pp. 1116-1126, vol. 185, No. 3.

M. Kaminska, M. Skowronski, and W. Kuszko, Identification of the .082-eV Electron Trap, E1 2 in GaAs, as an Isolated Antisite Arsenic Defect, Nov. 11, 1985, pp. 2204-2207, vol. 55, No. 20, ©1985 The American Physical Society.

J. Serrano, M. Cardona, T. Ruf, Spin-Orbit splitting in diamond: excitons and acceptor related states, Solid State Communications 113 (2000), pp. 411-414, ©2000 Elsevier Science Ltd.

D.E. Bliss, W. Walukiewicz, and J.W. Ager, III; E.E. Hailer, K.T. Chan, S. Tanigawa, Annealing studies of low-temperature-grown GaAs:Be, J. Apply. Phys. 71 (4), Feb. 15, 1992, pp. 1699-1707, 1992 American Institute of Physics, ©1992 American Institute of Physics.

James R. Chelikowsky and Marvin L. Cohen, Nonlocal pseudopotential calculations for the elecronic structure of eleven diamon and zinc-blende semiconductors, Physical Review B, Jul. 15, 1976, pp. 556-582, vol. 14, No. 2.

S.R. White and L.J. Sham, Electronic Properties of Flat-Band Semiconductor Heterostructures, Physical Review Letters, Sep. 21, 1981, pp. 879-882, vol. 47, No. 12, 1981 The American Physical Society, ©1981 The American Physical Society.

T. Obata, S. Fukushima, T. Araya, N. Otsuka, Photoluminescence of nearly stoichiometric LT-GaAs and LT-GaAs/A1As MQW, Journal of Crystal Growth 227-228 (2001), pp. 112-116, ©2001 Elsevier Science B.V.

Jun-Yuan Chen, Jenn-Gee Lo and Luke Su Lu, Optical Transitions via the Structure-Defect Levels Due to Lattice Vacancies in InSb, Japanese Journal of Applied Physics, Jun. 1991, pp. 1169-1175, vol. 30, No. 6.

U. Siegner, M. Haiml, F. Morier-Genoud, R.C. Lutz, P. Specht, E.R. Weber, U. Keller, Femtosecond nonlinear optics of low-temperature grown semiconductors, Physicia B 273-274, 1999, pp. 733-736, ©1999 Elsevier Science B.V.

M.R. Melloch, J.M. Woodall, and E.S. Harmon, Low-Temperature Grown III-V Materials, Annu. Rev. Mater. Sci., 1995, 25: 547-600, 1995 by Annual Reviews Inc.

Dietrich Marcuse and Tien-Pei Lee, On Approximate Analytical Solutions of Rate Equations for Studying Transient Spectra of Injection Lasers, IEEE Journal of QuantumElectronics, Sep. 1983, pp. 1397-1406, vol. QE-19, No. 9, ©1983 IEEE.

G.A. Baraff and M.A. Schluter, Electronic aspects of the optical-absorption spectrum of the EL 2 defect GaAs, Physical Review B, Apr. 15, 1992-I, pp. 8300-8309, vol. 45, No. 15, ©1991 The American Physical Society.

Jerome Faist, Federico Capaso, Deborah L. Sivco, Carlo Sirtori, Albert L. Hutchinson; Alfred Y. Cho, Quantum Cascade Laser, Science, New Series, Apr. 22, 1994, pp. 553-556, vol. 264, Issue 5158, ©1994 American Association for the Advancement of.

Jerome Faist, Federico Capasso, Carlo Sitori, Debbie Sivco, Albert L. Hutchinson, Sung-Nee G. Chu and Alfred Y. Cho, Mid-infrared field-tunable intersubband electroluminescence at room temperature by photon-assisted tunneling in couple-quantum wells, Appl. Phys. Lett. 64 (9), Feb. 28, 1994, pp. 1144-1146, ©1994 American Institute of Physics.

B. Grandidier, Huajie Chen, and R.M. Feenstra; D.T. McInturff; P.W. Juodawlkis and S.E. Ralph, Scanning tunneling microscopy and spectroscopy of arsenic antisites in low temperature grown InGaAs, Applied Physics Letters, Mar. 8, 1999, pp. 1439-1441, vol. 74, No. 10, ©1999 American Institute of Physics.

R.M. Feenstra, J.M. Woodall and G.D. Petit, Observation of Bulk Defects by Scanning Tunneling Microscopy and Spectroscopy: Arsenic Antisite Defects in GaAs, Aug. 23, 1993, pp. 1176-1179, vol. 71, No. 8, ©1993 The American Physical Society.

R.M. Feenstra, Cross-sectional scanning tunneling microscopy of III-V semiconductor structures, Semicond. Sci. Technol. 9, 1994, pp. 2157-2168, ©1994 IOP Publishing Ltd. (Printed in UK).

G.M. Martin, Optical assesment of the main electron trap in bulk semi-insulting GaAs, Appl. Phys. Lett 39(9), Nov. 1, 1981, pp. 747-748, ©1981 American Institute of Physics.

R. Errique Viturro, Michael R. Melloch, Jerry M. Woodall, Optical emission properties of semi-insulating GaAs grown at low temperatures by molecular beam epitaxy, Appl Phys. Lett. 60(24), Jun. 15, 1992, pp. 3007-3009, ©1992 Aerican Institttue of Physics.

A. Baldereschi, Nunzio O. Lipari, Spherical Model of Shallow Acceptor States in Semiconductors, Physical Review B, Sep. 15, 1973, pp. 2697-2709, vol. 8, No. 6.

A. Chantre, G. Vincent, D. Bois, Deep-level optical spectroscopy in GaAs, Physical Review B, May 15, 1981, pp. 5335-5359, vol. 23, No. 10, ©1981 The American Physical Society.

Peter C. Sercel and Kerry J. Vahala, Analytical formalism for determining quantum-wire and quantum-dot band structure in the multiband envelope-function approximation, Physical REview B, Aug. 15, 1990-II, pp. 3690-3710, vol. 42, No. 6, ©1990 the American Physical Society.

G. Lucovsky, On The Photoionization of Deep Impurity Centers in Semiconductors, Solid state Communications, 1965, pp. 229-302, vol. 3, Pergamon Press Ltd. (Printed in Great Britain).

P. Silverberg, P. Omiling, and L. Samuelson, Hole photoionization cross sections of EL2 in GaAs, Appl. Phys. Lett. 52 (20), May 16, 1988, pp. 1689-1691, ©1988 American Institute of Physics.

Evan O. Kane, Band Structure of Indium Antimonide, J. Phys. Chem. Solids., vol. 1, pp. 249-261, Pergamon Press 1957.

M. Jaros, Wave functions and optical cross sections associated with deep centers in semiconductors, Physical Review B, Oct. 15, 1977, pp. 3694-3706, vol. 16, No. 8.

G.A. Baraff, Stress splitting of the EL2 zero-phonon line: Need for reinterpretation of the main optical transition, Physical Review B, May 15, 1990-I, pp. 9850-9859, vol. 41, No. 14, ©1990 The American Physical Society.

Sokrates T. Pantelides, The electronic structure of impurities and other point defects in semiconductors, Reviews of Modern Physics, Oct. 1978, pp. 797-858, vol. 50, No. 4, ©1978 American Physical Society.

T.C.L.G. Sollner, E.R. Brown, W.D. Goodhue, and H.Q. Le, Observation of millimeter-wave oscillations from resonant tunneling diodes and some theoretical considerations of ultimate frequency limits, Appl. Phys. Lett. 50(6), Feb. 9, 1987, pp. 332-334, ©1987 American Institute of Physics.

S. Ahmed, M.R. Melloch, E.S. Harmon, D.T. McInturff, and J.M. Woodall, Use of nonstoichiometry to form GaAs tunnel junctions, Appl. Phys. Lett. 71 (25), Dec. 22, 1997, pp. 3667-3669, ©1997 American Institute of Physics.

E.R. Brown, C.D. Parker and T.C.L.G. Sollner, Effect of quasibound-state lifetime on the oscillation power of resonant tunneling diodes, Appl. Phys. Lett. 54 (10), Mar. 6, 1989, pp. 934-936, ©1989 American Institute of Physics.

G. Bremond, G. Guillot et A. Nouailhat, Spectres de sections efficaces absolues de photo-ionisation des ions de transition 3d dans Inp, Revue Phys. Appl. 22 (1987), pp. 873-879.

M.R. Melloch, D.D. Nolte, J.M. Woodall, J.C.P. Chang, D.B. Janes, and E.S. Harmon, Molecular Beam Epitaxy of Nonstoichiometric Semiconductors and Multiphase Material Systems, Critical Reviews in Solid State and Materials Sciences, 21(3) (1996), pp. 189-263, ©1996 by CRC Press, Inc.

* cited by examiner

Schottky Contact

USE OF DEEP-LEVEL TRANSITIONS IN SEMICONDUCTOR DEVICES

CROSS-REFERENCE TO RELATED APPLICATIONS

This application claims priority from U.S. Provisional Patent Applications Ser. No. 60/408,488 (filed Sep. 4, 2002) and Ser. No. 60/420,886 (filed Oct. 24, 2002), both of which are incorporated herein by reference.

FIELD OF THE INVENTION

The present invention relates generally to the field of semiconductor materials and devices, and more specifically to semiconductor materials and devices having an "artificial" energy band comprised of deep-level states.

BACKGROUND OF THE INVENTION

All semiconductor materials are characterized by an energy gap ($E_G$) greater than zero. The energy gap is defined as the difference between the conduction-band edge ($E_C$) and the valence-band edge ($E_V$). A deep-level state is defined as a state having an energy level at least 0.05 $E_G$ above the valence-band edge and at least 0.05 $E_G$ below the conduction-band edge.

A deep-level state can arise from a bound state of a substitutional impurity, an antisite, a vacancy on a lattice-site, an interstitial impurity, a dislocation, or a complex comprised of two or more deep-centers. For decades, semiconductor device designers have viewed deep-level states as something to be avoided, as their presence can degrade the performance (e.g., gain, speed) of many devices. As a result, traditional semiconductor processing techniques almost always seek to eliminate or minimize deep-level states.

At present, devices based on deep-level transitions are not being pursued because of widely-held beliefs that:
(1) optical-selection rules forbid deep-level-to-conduction band transitions;
(2) direct optical transitions (involving no phonons) from a deep-level to either the conduction or the valence band are very weak;
(3) phonons are required for deep-level-to-conduction-band, deep-level-to-valence-band, or deep-level-to-deep-level transitions (and that such phonon-assisted optical transitions are too unreliable, too weak, too irreproducible, or too temperature-dependent for use in devices); and,
(4) deep-levels always represent nonradiative recombination centers, and are not useful for optical or electrical devices.

Notwithstanding these commonly-held beliefs, devices based on deep-level transitions offer the potential to meet several long-felt, yet unsatisfied, needs in the art. In optoelectronics, for example, achieving a high degree of integration of electronics with optical devices is a long-desired, yet elusive, goal. GaAs circuits have achieved a very high degree of integration of electronic devices, but conventional GaAs optical devices operate at the 0.85 µm wavelength. In contrast, conventional InGaAs optical devices operate at the fiber optics wavelength of 1.3–1.5 µm. However, InP circuits have not achieved a level of device integration which is anywhere near that of GaAs device integration. InP device integration is still near its infancy. At present, the lack of very large scale monolithic integration of InP circuits with InGaAs optical devices has meant that some parts of optical modules are actually put together by hand (or with flip-chip bonding), which is very expensive indeed. Development of optically-active deep-level devices (that operate at fiber optic wavelengths) offers the potential to break this integration bottleneck, and enable monolithic integration of electronic and optoelectronic components on a single GaAs substrate. This is potentially a multibillion dollar industry.

Another long-felt, but unfulfilled need, exists in the manufacture of inexpensive light-emitting diodes ("LEDs"). At present, GaP accounts for about half the world's production of compound semiconductor substrates. These GaP substrates are used as large (eight-inch) substrates for visible (red, green, and yellow) LEDs. Such LEDs are fabricated on a lattice-matched substrate, then transferred to a GaP substrate. (For example, a red InGaP LED is removed from its GaAs substrate by epitaxial lift-off, and then transferred to a GaP substrate.) But this process of epitaxial lift-off and transfer to a GaP substrate substantially increases cost and lowers yield. The ability to fabricate visible LEDs directly on a GaP substrate (by using deep-level states) would obviate the need to remove LEDs from their original substrate and transfer LEDs to the GaP substrate, thus solving a long-standing problem in the multi-billion dollar LED industry.

Deep-level devices also offer the potential for integration of fiber optic components with Si electronics. For example, a deep-level device operating at 1.5 µm on GaAs could be integrated with Si electronics using Motorola's GaAs-on-Si technology. Alternatively, deep-level devices on GaP substrates could be integrated with Si using, for example, Oak Ridge National Laboratory's semiconductor-on-oxide-on-semiconductor technology, since GaP and Si have the same lattice constant (5.45 angstroms). The ability to effectively integrate fiber optic components with Si electronics would have tremendous market potential. This would be a multi-trillion dollar industry.

The invention, as described below, addresses these and other needs.

SUMMARY OF THE INVENTION

In general terms, the invention relates to the design, fabrication, and use of semiconductor devices that employ deep-level transitions (i.e., deep-level-to-conduction-band, deep-level-to-valence-band, or deep-level-to-deep-level) to achieve useful results. To facilitate the "engineering" of useful devices based on deep-level transitions, it is important to (i) dispel the traditional (and pervasive) misunderstandings about deep-center transitions and (ii) provide a reliable analytical model to predict the device-relevant properties of such transitions.

Contrary to traditional thinking in the art, the inventor has discovered that:
(1) optical-selection rules do not forbid deep-level-to-conduction-band or deep-level-to-valence-band transitions;
(2) direct optical transitions from a deep-level to either the conduction or the valence band are inherently strong;
(3) phonons are not required for deep-level-to-conduction-band, deep-level-to-valence-band, or deep-level-to-deep-level transitions;
(4) although phonons may be involved in deep-level optical transitions, the total strength of the optical transition (integrated over energy) is independent of the presence of phonons (i.e., phonons may change the shape (as a function of energy) of the deep-level optical spectrum, but phonons do not change the total strength of the optical transition); and, (5) deep-levels need not always function as nonradiative recombination centers, but may instead be designed to function as the upper or lower band of a radiative optical transition.

A principal aspect of the invention involves devices in which electrical transport occurs through a band of deep-level states and just the conduction band (or through a deep-level band and just the valence band), but-where significant current does not flow through all three bands. This means that the deep-state is not acting as a nonradiative trap, but rather as an energy band through which transport takes place. Advantageously, the deep-level energy-band may facilitate a radiative transition, acting as either the upper or lower state of an optical transition.

In accordance with one aspect of the invention, design of useful deep-level devices is facilitated by a novel, eight-band $\vec{k} \cdot \vec{p}$ model of deep-center states. This model exhibits good agreement with experimental measurements, and allows device designers to predict both the size and spectral shape of the strength of deep-level optical transitions to (i) the conduction band and/or (ii) the valence band, as well as (iii) optical-selection-rules, (iv) and the spatial extent of the deep-level bound state, (v) for a wide variety of deep-levels in a wide variety of (small and large bandgap) semiconductors.

In accordance with another aspect of the invention, a deep-level semiconductor device may include: (i) a semiconductor host material, having a valence-band energy, $E_V$, a conduction-band energy, $E_C$, and an energy gap, $E_G$; (ii) an optically-active region, formed in the host material, the optically-active region having one or more deep-level state(s) with energy at least $0.05E_G$ above $E_V$ and at least $0.05 E_G$ below $E_C$; and (iii) means (e.g., one or more regions abutting the optically-active region) for injecting carriers into the optical region to produce optical transition(s) between one or more of the deep-level state(s) and the conduction- or valence-band of the host material. The host material may comprise a direct or indirect bandgap semiconductor material. The host material may also comprise an elemental semiconductor material (such as Si, Ge, C, and Sn), a binary compound semiconductor material (such as GaAs, GaN, SiC, ZnS, ZnSe, PbS, PbSe, CdTe, HgTe, InAs, InSb, GaP, SiGe, or InP), a ternary compound semiconductor material (such as InGaN, AlGaN, InAlN, InGaSb, InSbAs, HgCdTe, InGaAs, InGaP, or AlGaAs), or a quaternary compound semiconductor material (such as InGaAlN, InGaAsN, AlGaAsN, InGaAsSb, PbSnSSe, HgCdTeSe, InGaAlAs, InGaAsP, or AlGaAsP). Where injected carriers produce deep-level-to-valence-band transitions, the means for injecting carriers preferably injects carriers into both the deep-level state(s) and the valence band. Where injected carriers produce conduction-band-to-deep-level transitions, the means for injecting carriers preferably injects carriers into both the deep-level state(s) and the conduction band. The means for injecting carriers may comprise one or more of: an n-type region; a p-type region; a metallic region; an oxide region; a Schottky contact; and/or, a region of semiconductor material different than the host material. The deep-level state(s) in the optically-active region are created, at least in part, by one or more of the following: substitutional impurities (such as Cr substitution at anion sites in the host material, Fe substitution at anion sites in the host material, or O substitution at anion or cation sites in the host material); antisites (such as cation-on-anion sites or anion-on-cation sites in the host material); vacancies (such as cation or anion vacancies in the host material); interstitials (such as anion or cation or substitutional impurity at an interstitial site); dislocations in the host material; and/or complexes formed from two or more deep-centers (for example, substitutional impurities, antisites, vacancies, interstitials, or dislocations). The GaAs host material may be used to produce optical transition wavelength(s) in the range of 1.3–1.55 µm. Such deep-level devices may be integrated with a plurality of GaAs MESFETs on a single GaAs substrate, or integrated with a plurality of Si semiconductor devices. Deep-level semiconductor devices may also be realized on GaP host material that is grown on a lattice-matched Si substrate, where the Si substrate also supports a plurality of monolithically-fabricated Si semiconductor devices. The GaP host material may be used to produce optical transitions at wavelengths in the visible range, as well as in the range of 1.3–1.55 µm.

According to yet another aspect of the invention, a method for making a deep-level, optically-active semiconductor device may involve: (i) providing a semiconductor host material, having a valence-band energy, $E_V$, a conduction-band energy, $E_C$, and an energy gap, $E_G = E_C - E_V$; (ii) processing a region of the host material to create an optically-active region wherein a conduction-band-to-deep-level or deep-level-to-valence-band or deep-level-to-deep-level transition produces light of a desired wavelength; and (iii) abutting the optically-active region with one or more material(s) selected to enhance carrier transport that supports the desired light-producing transition. Providing a host material may involve growing an elemental semiconductor material, growing a binary compound semiconductor material (such as GaP grown on a Si substrate), growing a ternary compound semiconductor material, growing a quaternary compound semiconductor material, or growing a more complex compound semiconductor material comprised of more than four constituent elements. Processing a region of the host material to create an optically-active region may involve one or more of the following: growing the optically-active region under low-temperature growth conditions; adjusting growth conditions to. introduce substitutional deep-impurities; adjusting conditions to favor nonstoichiometric growth (anion-rich or cation-rich conditions); adjusting growth conditions to introduce antisites while growing the optically-active region; adjusting growth conditions to introduce vacancies while growing the optically-active region; adjusting growth conditions to introduce dislocations while growing the optically-active region; introducing interstitial impurities while growing the optically-active region; and/or undergoing one or more heat treatments. Abutting the optically-active region with a material selected to enhance carrier transport may involve abutting the optically-active region with one or more material(s) that enhance(s) carrier transport into both upper and lower states of the light-producing transition, such as: an n-type material; a p-type material; a metal; an oxide material; or a semiconductor material different from that of the optically-active region. For increased device efficiency, the materials abutting the optically-active region are preferably chosen to maximize carrier injection into the upper and lower states of the optical transition, as well as to minimize carrier injection into any energy levels which do not participate in the optical transition.

Still further aspects and advantages of the instant invention will become apparent in light of the figures, description and claims which follow.

BRIEF DESCRIPTION OF THE FIGURES

Certain aspects of the present invention are illustrated in the accompanying set of figures, which is intended to be illustrative rather than limiting, and in which.

DESCRIPTION OF ILLUSTRATIVE EMBODIMENTS

Figure 1:
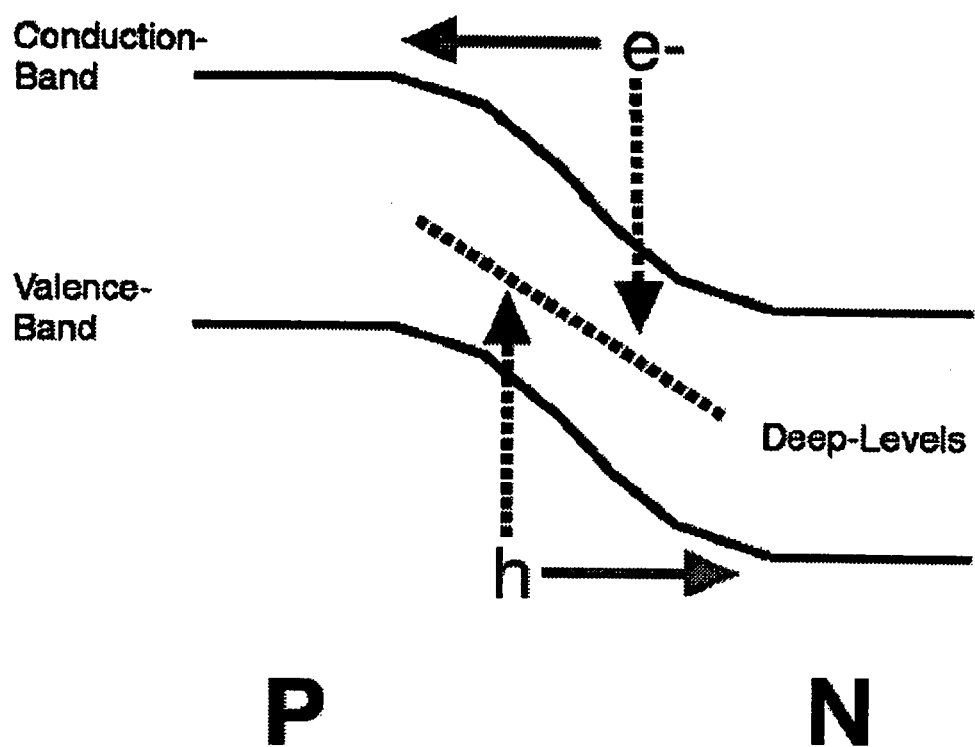
FIG. 1 illustrates typical deep-level interactions in conventional p-n junction semiconductor devices.

Conventional behavior is illustrated in FIG. 1. In a conventional p-n junction, electron transport occurs through the conduction band, and hole transport occurs through the valence band. (This transport through a conventional p-n junction is indicated by the solid arrows.) In a conventional p-n junction, deep-levels act as nonradiative recombination centers. (This is indicated by the dotted arrows, which show the trapping by deep-levels of electrons from the conduction band and holes from the valence band.)

Figure 2:
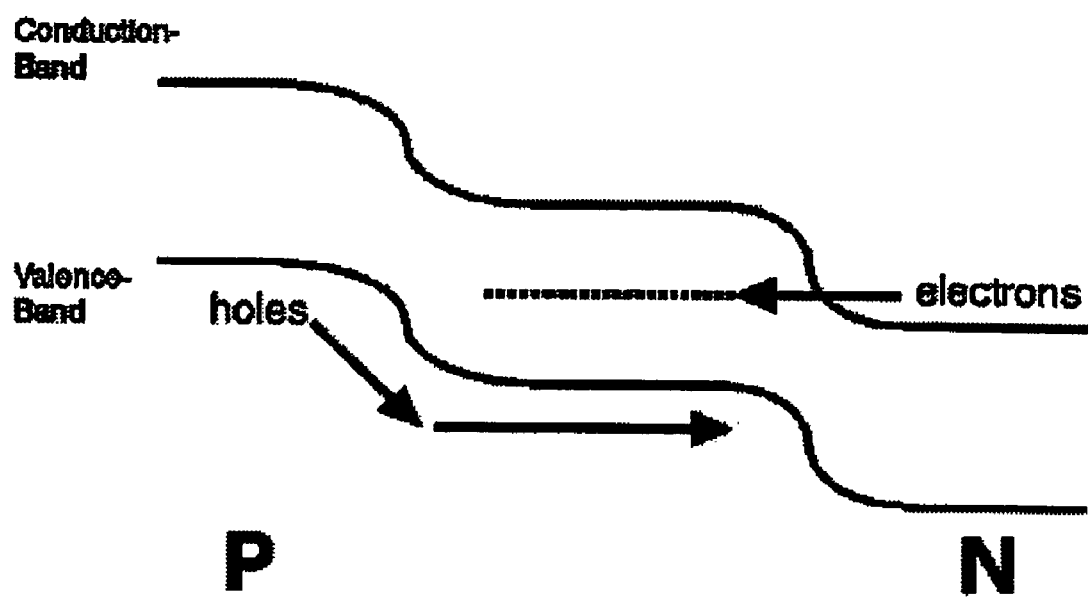
FIG. 2 depicts an exemplary band structure for a semiconductor device having an "artificial" energy band comprised of deep-level states.

FIG. 2 shows a band diagram for an exemplary deep-level optical emitter. In this device, an optical transition occurs between the deep-level (indicated by the dashed line) and the valence-band. Electrons are injected into the deep-level from the n-type region, whereas holes are injected from the p-type region into the optically-active central region.

Figure 3:
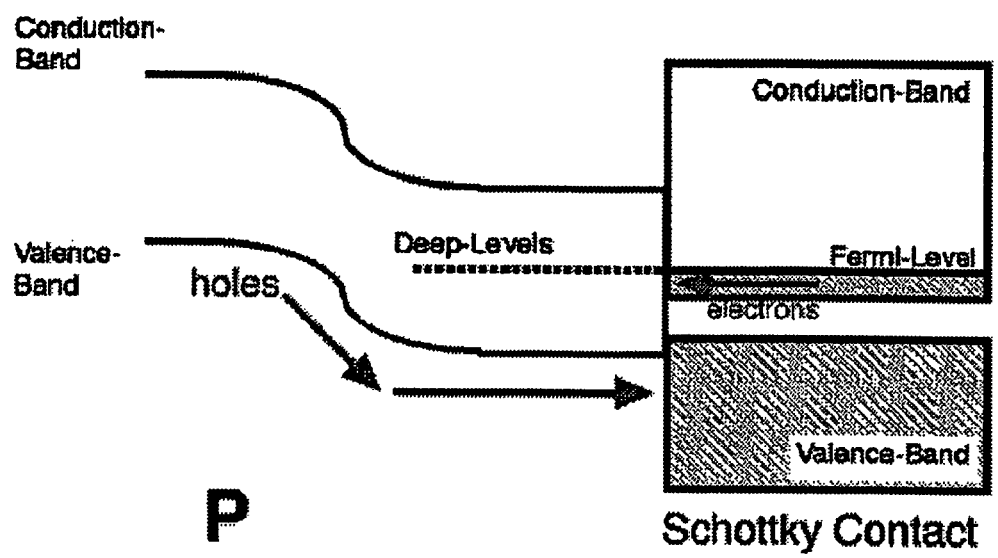
FIG. 3 shows the use of a Schottky contact to inject electrons into a deep-level energy band and holes into the valence band from the p-region.

In FIG. 3, the efficiency of the deep-level optical emitter is improved through the addition of a Schottky contact carrier-injection means. Through advantageous band alignment, the Schottky contact injects electrons into the deep-level band and holes are injected into the valence band from the p-region, thus supporting the desired deep-level-to-valence-band optical transition.

For maximal efficiency, carriers should be injected into only the upper-state and only the lower-state of an optical transition. (I.e., few carriers should end up in states not involved in the optical transition.) As depicted in FIGS. 2–3, an efficient emitter injects electrons into only the upper state of the optical transition and injects holes into the lower state of the optical transition. (Both optical processes and nonradiative processes try to depopulate the upper state and populate the lower state of the optical transition.)

Figure 4:
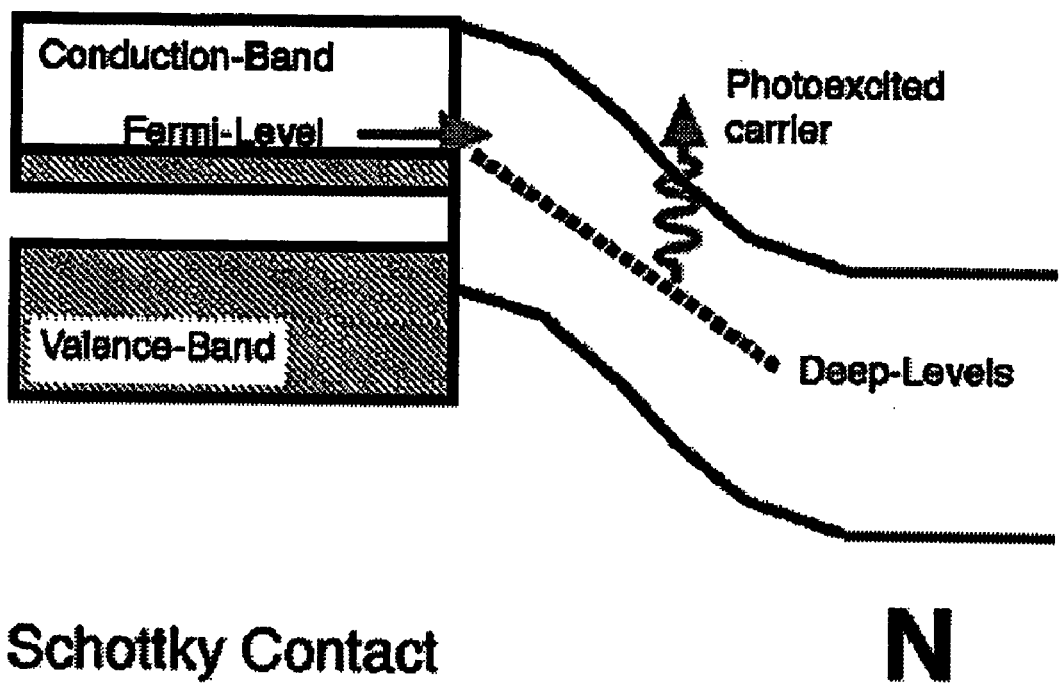
FIG. 4 illustrates the use of Schottky contact to inject electrons into a deep-level energy band of an exemplary optical detector.

FIG. 4 provides an exemplary band diagram for an efficient optical detector that injects electrons into only the lower-state of the optical transition, and collects electrons only from the upper-state of the optical transition. An efficient carrier-injection mechanism is provided by the Schottky contact, whose energy-band lineup with respect to the host semiconductor is shown.

An efficient optical detector should inject carriers into only the lower state of the optical transition (since this lower state would be depopulated by the optical transition). This is indicated schematically in FIG. 4.

Figure 5:
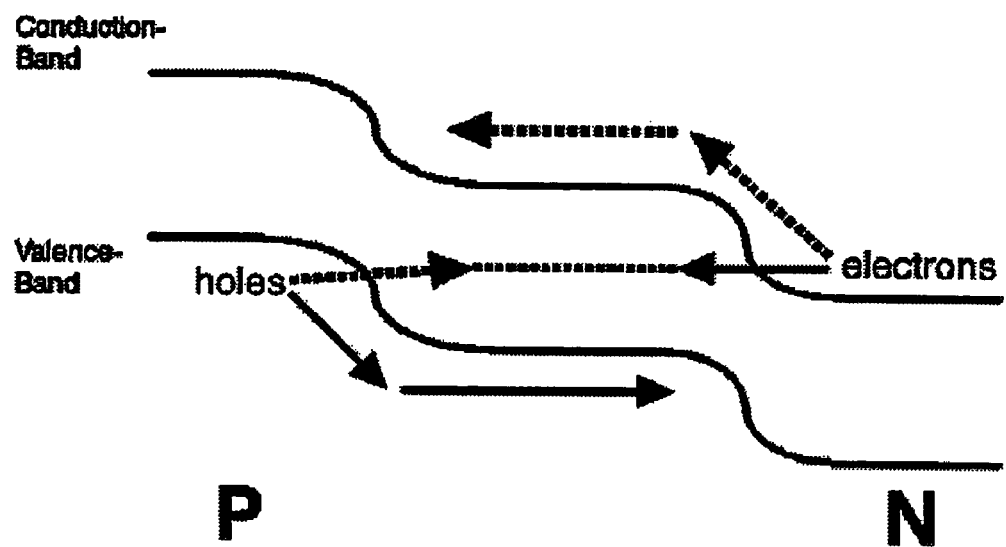
FIG. 5 illustrates several electron/hole transport processes for an illustrative deep-level optical emitter.

Efficient optical emitters and detectors need only two of the three bands (valence band, conduction band, and deep-level band) to be populated with electrons and holes: specifically, the two bands that correspond to the upper and lower states of the desired optical transition. Large populations in all three energy bands will reduce efficiency, since only two of the three bands actually participate in the optical transition. Consider, for example, FIG. 5: here, it is desirable to inject electrons into the deep-level and holes into the valence band. The dashed arrows show mechanisms that reduce the efficiency of the optical emitter. Such mechanisms include significant injection of electrons into the conduction band (instead of the deep-level), and significant injection of holes into the deep-level (instead of the valence-band). The presence of a large number of conduction-band electrons also increases the number of possible Auger processes.

Figure 6:
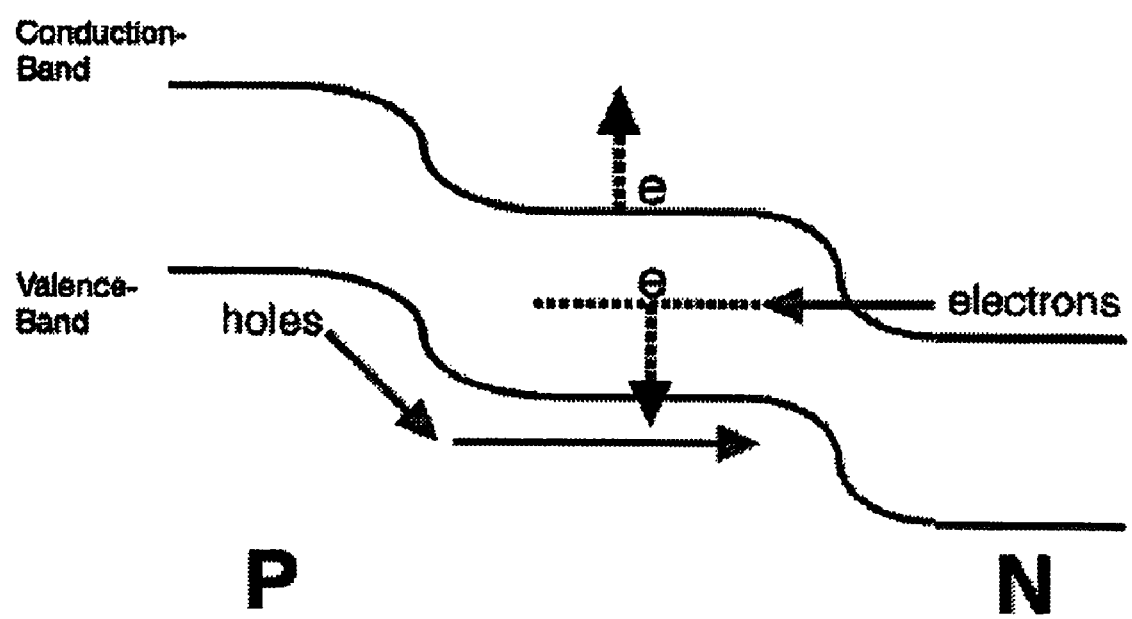
FIG. 6 depicts an exemplary CDCH Auger process.
Figure 7:
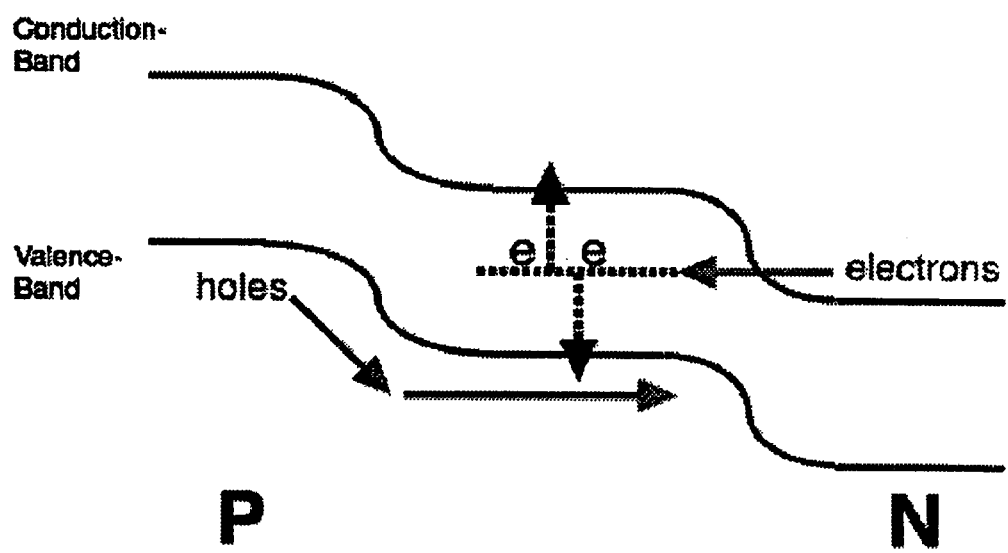
FIG. 7 depicts an exemplary DDCH Auger process.

Large carrier populations in all three energy bands increase undesirable Auger rates, which depopulate the upper state of an optical transition and populate the lower state of an optical transition. This is shown in FIGS. 6 and 7. In the depicted optical emitters, it is desirable to inject electrons into the deep-level and holes into the valence band. But the depicted Auger processes frustrate this goal.

In FIG. 6, the dashed arrows show one particular Auger mechanism: the conduction-band-deep-level-conduction-band-hole (CDCH) Auger process. As a result of this CDCH Auger process, the two initial electrons (one in the conduction band and one in the deep-level) end up as a high-energy electron in the conduction band and an electron in the valence band. The presence of a large number of conduction-band electrons increases the rate of this Auger process. Thus, it is preferable to minimize the injection of electrons into the conduction band in this particular emitter.

The dashed arrows in FIG. 7 show another Auger mechanism: the deep-level-deep-level-conduction-band-hole (DDCH) Auger process. Here, the two initial electrons (both in the deep-level) end up, respectively, as an electron in the conduction band and an electron in the valence band.

For devices utilizing deep-level-to-valence-band transitions, certain Auger processes can be suppressed by designs that place the deep-level below mid-gap. As shown in FIG.

Figure 8:
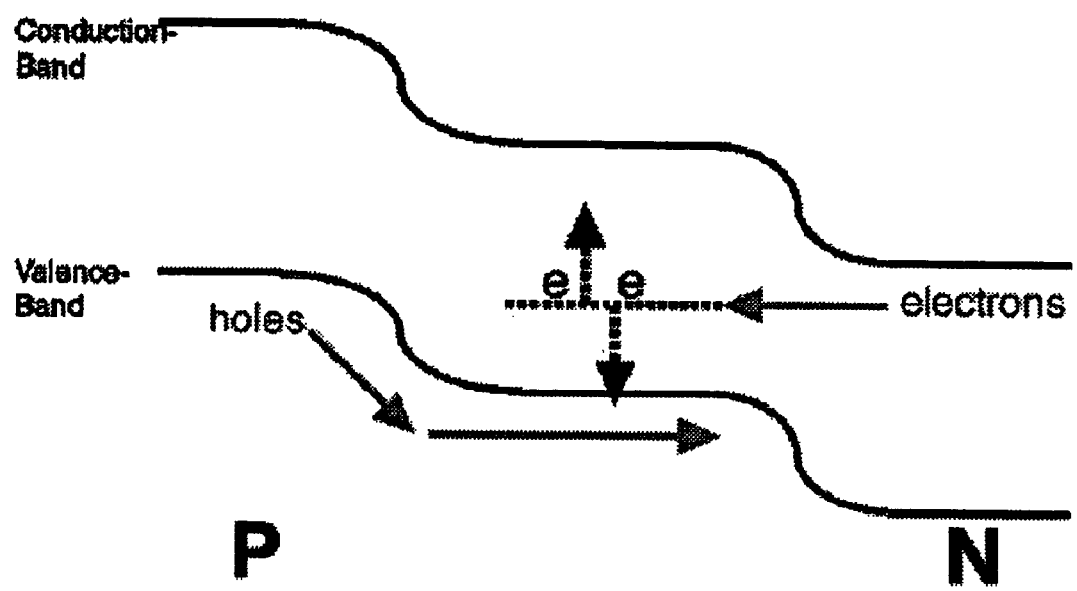
FIG. 8 illustrates a band structure useful in suppressing certain DDCH Auger processes.

8, energy conservation forbids those DDCH Auger processes which result in low-energy holes. Thus, some of the DDCH Auger processes are suppressed. For devices utilizing deep-level-to-conduction-band transitions, certain Auger processes can be suppressed by designs that place the deep-level above mid-gap. In such cases, by analogy to FIG. 8, energy conservation forbids those DDCH Auger processes which result in low-energy electrons. Thus, some of the DDCH Auger processes are suppressed.

Figure 9:
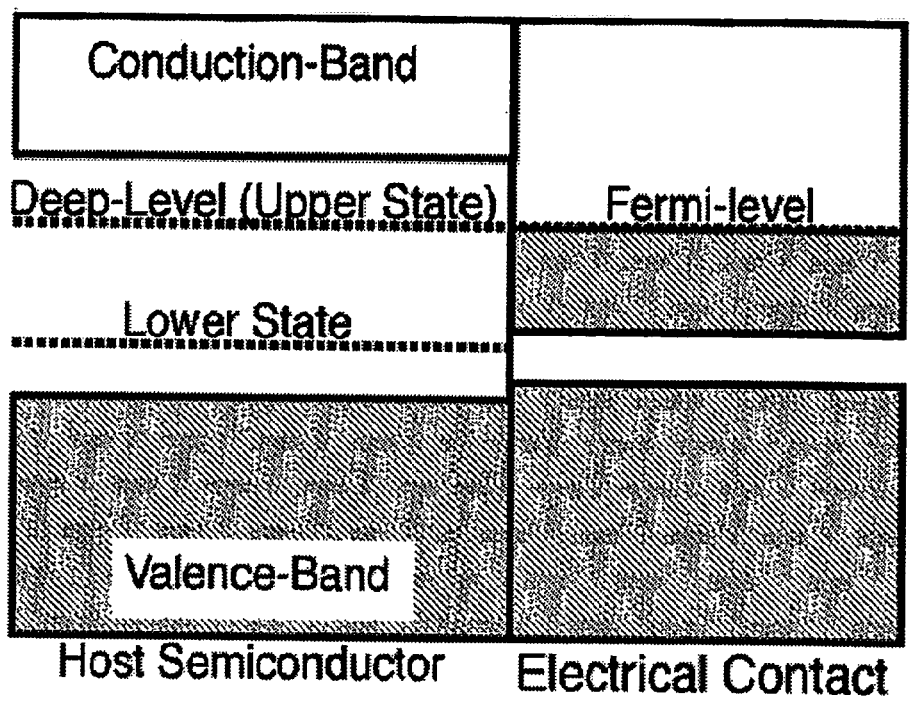
FIG. 9 shows an illustrative alignment between bands of a carrier-injecting contact and a host semiconductor material.

FIG. 9 depicts a preferred band alignment in accordance with the invention. For efficient current injection, the electrical contact to the upper energy level should have a Fermi level which is closer to the upper energy level than it (the contact Fermi level) is to the lower energy level or to any irrelevant energy bands (either the conduction or the valence band, whichever is not involved in the transition) or to any other irrelevant deep-levels.

Figure 10:
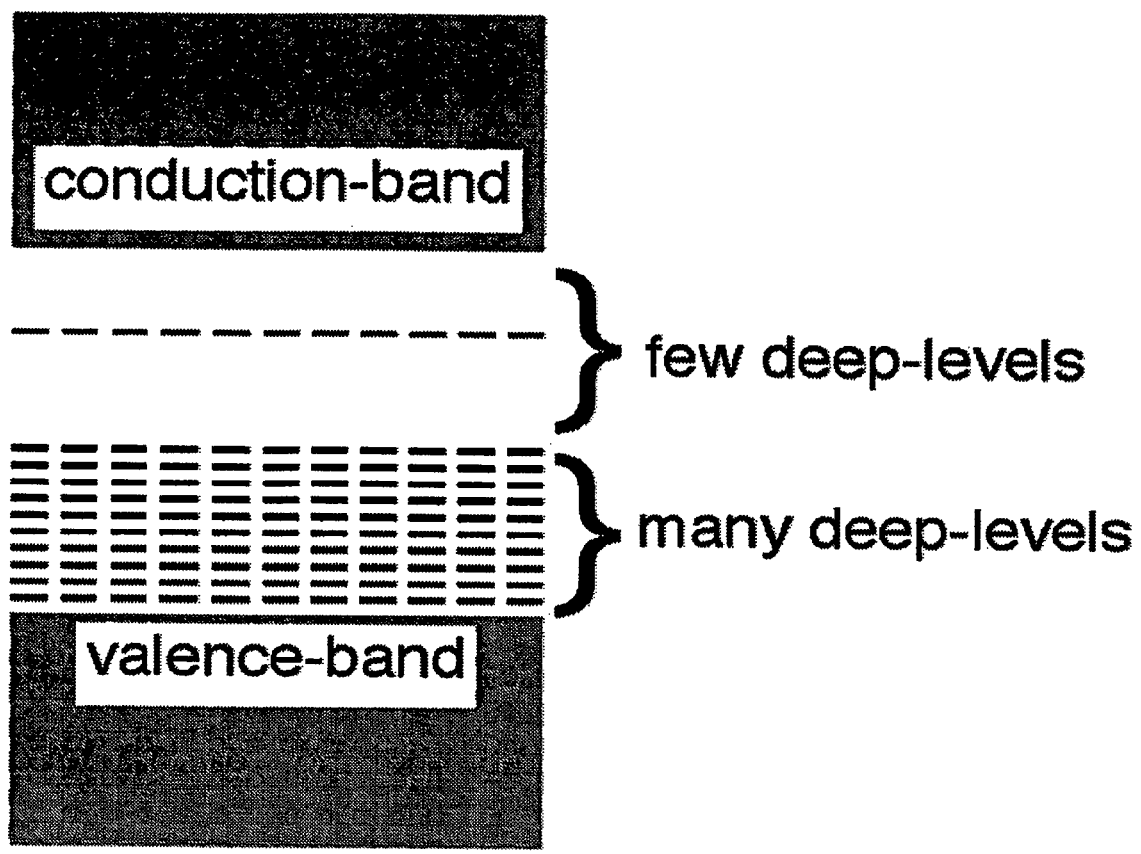
FIG. 10 shows deep-levels which form an energy band which is closer to the valence-band than to the conduction-band.

FIG. 10 shows deep-levels which form an energy band which is closer to the valence-band than to the conduction-band. This is useful for devices, as its function is to artificially "raise" the valence-band edge.

Figure 11:
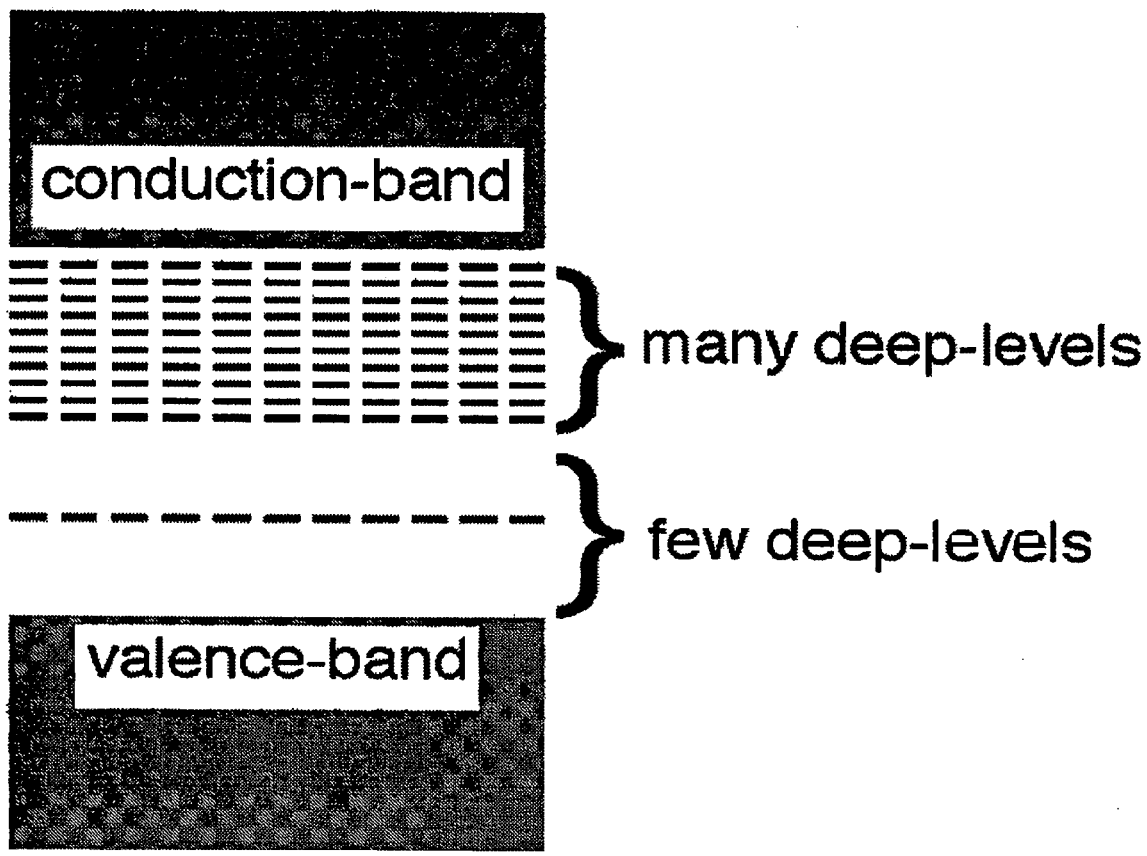
FIG. 11 shows deep-levels which form an energy band which is closer to the conduction-band than to the valence-band.

FIG. 11 shows deep-levels which form an energy band which is closer to the conduction-band than to the valence-band. This is useful for devices, as its function is to artificially "lower" the conduction-band edge.

Figure 12:
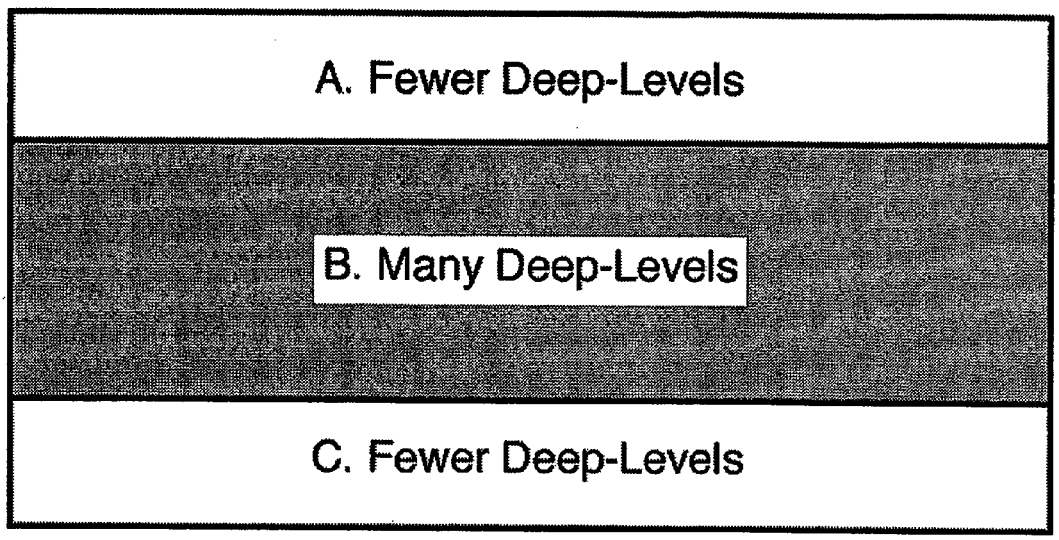
FIG. 12 shows a semiconductor having three layers (A,B, C), where one layer (layer B) has many more deep-levels than the other two layers (layers A and C)

FIG. 12 shows a semiconductor having three layers (A,B,C), where one layer (layer B) has many more deep-levels than the other two layers (layers A and C). The deep-level concentrations in each of the different layers (layers A,B,C) can be changed by:
(a) changing the substrate growth temperature (lowering the growth temperature during layer B), or
(b) changing the growth rate (lowering the growth rate during layer B), or
(c) a combination of lowered growth rate at lowered growth temperatures.

An abrupt change in deep-level concentration can be implemented by an abrupt change in growth rate, which is easily accomplished with the techniques of molecular beam epitaxy (MBE) or metal-organic-chemical-vapor-deposition (MOCVD).

Figure 13:
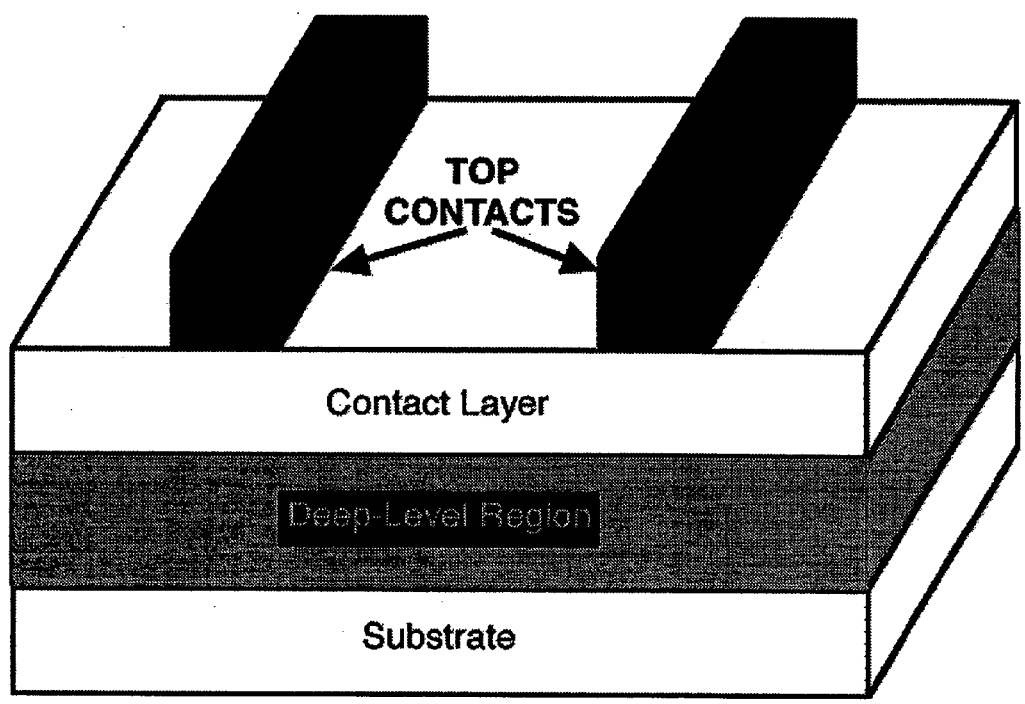
FIG. 13 shows a "TST" device (a top-contact-semiconductor-top-contact device)

FIG. 13 shows a "TST" device (a top-contact-semiconductor-top-contact device). A TST device is defined as a semiconductor device wherein two or more of its electrical contacts are located directly on the top surface of the sample. By locating two or more electrical contacts directly on the top surface of the sample, this device is very easy to fabricate. (Processing this device could involve only one lithographic step. One procedure would involve deposition of a metal, oxide, or semiconductor layer, then a lithographic mask step, followed by an etch of the excess metal, oxide, or semiconductor layer. Another procedure would involve a lithographic mask step, followed by deposition of a metal, oxide, or semiconductor layer, and then liftoff of the excess metal, oxide, or semiconductor layer.)

Figure 14:
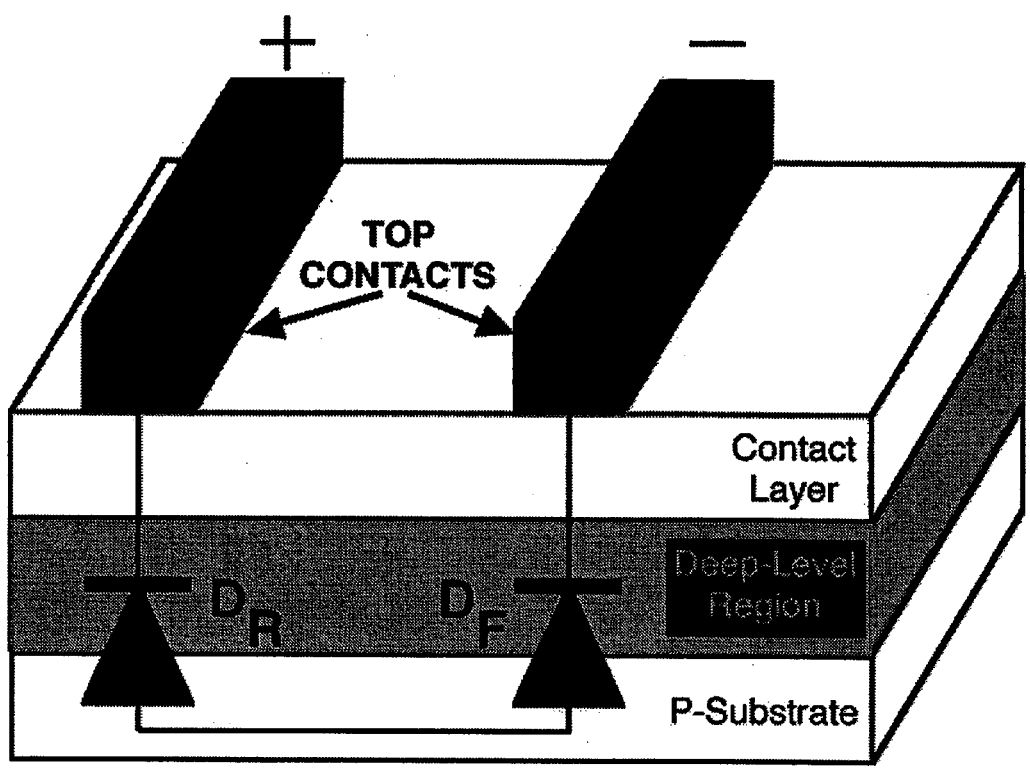
FIG. 14 shows the equivalent circuit of a TST device in which the substrate is p-type.

FIG. 14 shows the equivalent circuit of a TST device in which the substrate is p-type.

Figure 15:
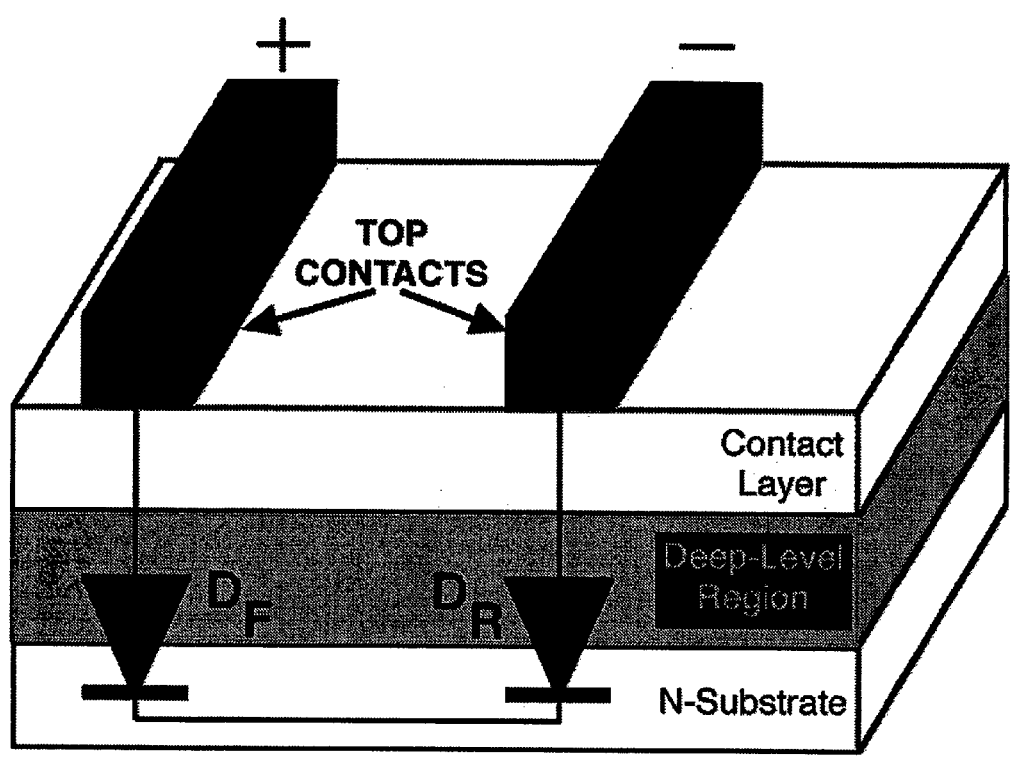
FIG. 15 shows the equivalent circuit of a TST device in which the substrate is n-type; and, FIG. 16 shows a semiconductor deep-level device, in which direct electrical contact is made to the top side of the deep-level region via both a "TOP CONTACT" and a "Contact Layer," and direct electrical contact is made to the bottom side of the deep-level region via both the "Substrate" and a "BOTTOM CONTACT."

FIG. 15 shows the equivalent circuit of a TST device in which the substrate is n-type.

As in conventional metal-semiconductor-metal (MSM) devices, TST devices connect in series one forward-biased junction ($D_F$) with one reverse-biased junction ($D_R$), as shown in FIGS. 14 and 15. If the deep-level-region-to-substrate junction is designed to operate in reverse-bias, then the forward-biased junction is operated merely as a resistor. If the deep-level-region-to-substrate junction is designed to operate in forward-bias, then the reverse-biased junction should be a leaky junction and is operated merely as a resistor.

The nature of carrier injection into the semiconductor deep-level device depends on the nature of the electrical contacts. Deep-level emitters may be more efficient when one or more of the electrical contacts has a nonlinear current-voltage characteristic. Specifically, deep-level devices are likely to be efficient when one or more of the electrical contacts has a sharply increasing and nonlinear current-voltage characteristic. (In other words, when the current is a nonlinear function of voltage across one or more electrical contacts, or when the current across one or more contacts increases sharply as a function of voltage, devices are observed to be more efficient. For example, this occurs when one contact is not ohmic, but exhibits a diode-like current-voltage characteristic.)

Figure 16:
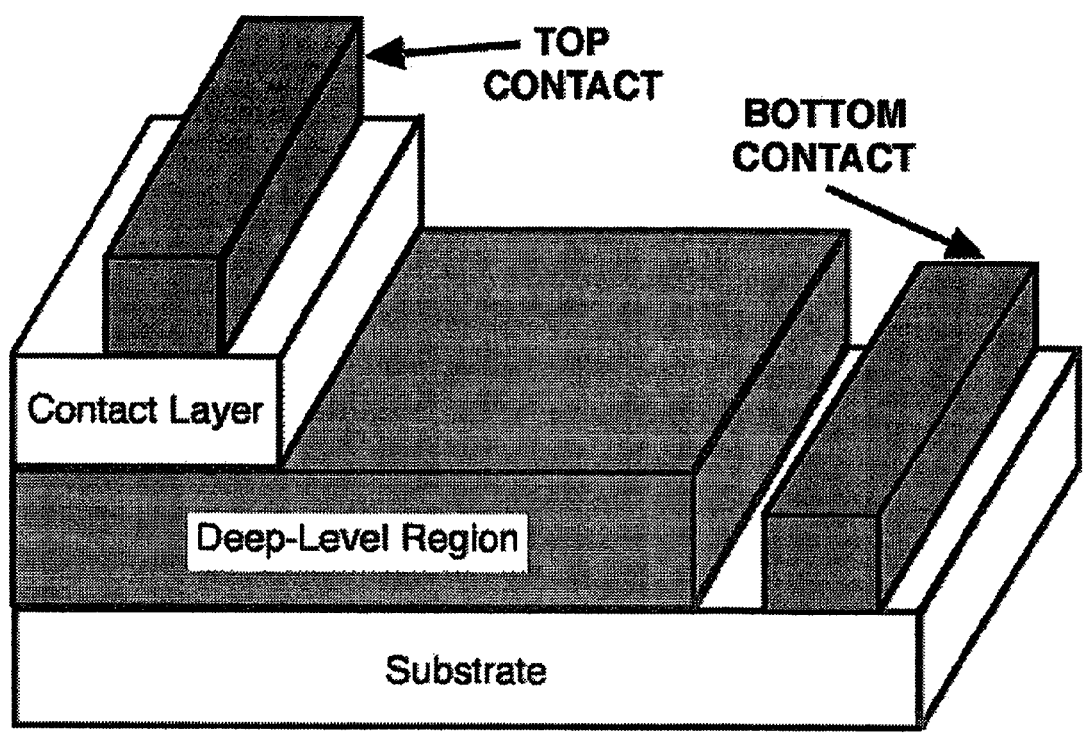

FIG. 16 shows a semiconductor deep-level device, in which direct electrical contact is made to the top side of the deep-level region via both a "TOP CONTACT" and a "Contact Layer," and direct electrical contact is made to the bottom side of the deep-level region via both the "Substrate" and a "BOTTOM CONTACT."

Deep-level devices can often be operated under both voltage polarities: the voltage at the top contact (labelled "TOP CONTACT" in FIG. 16) can be either positive or negative with respect to the voltage at the bottom contact (labelled "BOTTOM CONTACT" in FIG. 16). (This is in sharp contrast to conventional semiconductor devices. Normally, pn-junctions are operated under just one voltage polarity: forward bias for light emitters, and reverse bias for photodetectors. In accordance with the invention, however, deep-level devices (light emitters, detectors, and other two-terminal devices) can be operated under either forward or reverse bias.) This will strongly influence how semiconductor deep-level devices will be operated and fabricated. (It will make semiconductor deep-level devices more flexible to operate and easier to fabricate.)

Both the sign and the magnitude of the operating voltage can be used to change the optical properties of the semiconductor deep-level device. (In other words, both the sign and the magnitude of the operating voltage can be used to change: the selection-rules, the strength, and the spectral shape of the optical transitions in a deep-level device.)

In accordance with the invention, the energy of a deep-level optical transition can be selected by:
changing the energy of the deep-level within the bandgap of the host semiconductor material;
changing the particular deep-center itself (e.g., changing the particular substitutional impurity, antisite, vacancy, interstitial, dislocation, or complex formed from two-or-more of these);
changing the bandgap energy of the host semiconductor material (e.g., using different elemental or compound semiconductors (binaries, ternaries, quaternaries, or any other compound semiconductor));
changing the doping of the host semiconductor material which contains the deep-centers (i.e., doping the host semiconductor p-type moves the Fermi-level closer to the valence-band, and doping the host semiconductor n-type moves the Fermi-level is closer to the conduction-band; the position of the Fermi-level determines the population distribution of the different ionization states of the deep-centers, and also determines the energy of the peak in the optical spectrum); and/or,
heat treatments, which may affect the spectrum (density of states) or position of the deep-levels.

The host material should be chosen to have a bandgap greater than the desired optical transition energy. The exact choice of the bandgap of the host material will also depend on where within the bandgap (closer to the conduction- or valence-band) one wishes to place the deep-level(s). The choice of a particular host material will also depend on the application. For monolithic integration with either Si or GaAs electronics, the host material could be chosen to be either Si or GaAs or GaP.

Introduction of deep-centers into the host material or the ensuing device fabrication may place many deep-levels throughout the bandgap of the host material. Besides the upper- and lower-state of the optical transition, there may be other energy-levels which are unrelated to the electrical or optical properties of the device.

In both electrical and optoelectronic devices, it is important to minimize any energy-levels which exist between the relevant upper- and lower-states (the "artificial" conduction- and valence-bands). Any energy-levels which exist between the relevant upper- and lower-states (the "artificial" conduction- and valence-bands) act as nonradiative recombination centers.

The relevant upper- and lower-states of the device should be chosen to have very few enery-levels between them. (I.e., the device should be designed to have a very small density-of-states between the upper- and lower-states relevant to the device).

FIGS. 10 and 11 show examples of this type of deep-level design. Since there is a low density-of-states for deep-levels between the dominant-deep-level-band and the valence-band in FIG. 11, the valence-band-to-deep-level transition in FIG. 11 is useful in devices. In FIG. 10, since there is a low density-of-states for deep-levels between the dominant-deep-level-band and the conduction-band, the conduction-band-to-deep-level transition in FIG. 10 is useful in devices.

If there is just a single deep-level-energy-band within the bandgap of the host material, this deep-level-energy-band should be placed as far as possible from the irrelevant energy-band in order to reduce the number of possible Auger processes. For example, in order to reduce the number of possible Auger processes in devices utilizing a conduction-band-to-deep-level transition, the deep-level-band should be placed near the conduction-band and far from the valence-band. Similarly, in order to reduce the number of possible Auger processes in devices utilizing a valence-band-to-deep-level transition, the deep-level-band should be placed near the valence-band and far from the conduction-band.

If there are just two dominant-deep-level-energy-bands within the bandgap of the host material, then both dominant-deep-level-energy-bands should be placed as far as possible from both the conduction- and valence-bands (both of which are now irrelevant energy-bands) in order to reduce the number of possible Auger processes. For example, in order to reduce the number of possible Auger processes in devices utilizing a deep-level-to-deep-level transition, both deep-levels should be placed near midgap, away from both the conduction- and valence-bands. The separation between the two deep-level-energy-bands is preferably less than ⅓ of the bandgap energy of the host semiconductor. In other words, if $E_C$, $E_V$, $E_2$, and $E_1$, are, respectively, the conduction-band edge, the valence-band edge, and the upper and lower deep-levels, then the deep-levels should be chosen such that both $E_C-E_2$ and $E_1-E_V$ are substantially larger than $E_2-E_1$ in order to reduce the number of possible Auger processes.

Ideally, one would like to fill the dominant-deep-level-energy-band directly: For example, by carrier injection into the dominant-deep-level-energy-band from a contact whose Fermi-level is at about the same energy as the dominant-deep-level-band, followed by efficient carrier transport through the dominant-deep-level-energy-band. However, if the dominant-deep-level-energy-band cannot be filled in this ideal manner, one can invoke the more conventional carrier transport through both the conduction- or valence-bands followed by carrier relaxation into the dominant-deep-level-energy-band from either the conduction- or valence-bands. The presence of many deep-levels between the dominant-deep-level-energy-band and the conduction- (or valence-) bands increases the efficiency of carrier relaxation into the dominant-deep-level-energy-band from the conduction- (or valence-) bands.

This is shown in FIGS. 10 and 11. If the density-of-states of deep-levels is as shown in FIG. 11, then it is desirable to design devices for the dominant-deep-level-to-valence-band transition, since there are very few energy levels between the dominant-deep-level-energy-band and the valence-band. Moreover, the dominant-deep-level-energy-band can be filled from the conduction-band, if carrier relaxation from the conduction-band into the dominant-deep-level-energy-band is fast: this is likely to be true if there are many deep-levels located between the conduction-band and the dominant-deep-level-energy-band.

Similarly, if the density-of-states of deep-levels is as shown in FIG. 10, then it is desirable to design devices for the dominant-deep-level-to-conduction-band transition, since there are very few energy levels between the dominant-deep-level-energy-band and the conduction-band. Moreover, the dominant-deep-level-energy-band can be filled from the valence-band, if carrier relaxation from the valence-band into the dominant-deep-level-energy-band is fast: this is likely to be true if there are many deep-levels located between the valence-band and the dominant-deep-level-energy-band.

In deep-level optoelectronic devices, the relative strengths of the deep-level-to-deep-level, deep-level-to-conduction-band, and deep-level-to-valence-band transitions rank as follows: If the final state is the conduction-band or a state near the conduction-band, then the transition strength is stronger if the initial state is closer to the valence-band. Similarly, if the final state is the valence-band or a state near the valence-band, then the transition strength is stronger if the initial state is closer to the conduction-band.

Deep-level-to-conduction-band and deep-level-to-valence-band transitions are strongest when the final energy is about $\hbar^2\alpha^2/2m_{eff}$ beyond the band edge, where, in the case of deep-level-to-conduction-band transitions, $m_{eff}$ is the conduction-band effective-mass for deep-level-to-conduction-band transitions and where, in the case of deep-level-to-valence-band transitions, $m_{eff}$ is the heavy-hole effective-mass for deep-level-to-valence-band transitions. Thus, deep-level-to-valence-band transitions would exhibit a narrow optical transition spectrum, and deep-level-to-conduction-band transitions would exhibit a broader optical transition spectrum. Devices requiring a narrow optical transition spectrum would therefore benefit from using a deep-level-to-valence-band transition, and devices requiring a broad optical transition spectrum would benefit from using a deep-level-to-conduction-band transition. The spectrum of the deep-level-to-conduction-band transitions is broader than the spectrum of deep-level-to-valence-bands by about a factor of $m_{HH}/m_{CB}$.

Deep-level-to-valence-band transitions show a higher peak (by about a factor of $m_{HH}/m_{CB}$) in the optical transition spectrum than deep-level-to-conduction-band transitions. Thus, devices requiring a strong peak in the optical transition spectrum would benefit more from using a deep-level-to-valence-band transition, rather than from using a deep-level-to-conduction-band transition.

The deep-level optical transition strength is proportional to the Kane matrix element (written in the literature as P or <s?z?z>). For stronger deep-level optical transitions, one should choose a host material having a stronger Kane matrix element.

Thus, design constraints on the transition strength may determine where one seeks to place the deep-level within the bandgap of the host semiconductor. This, in turn, may determine which deep-center one employs in the host semiconductor.

There typically exists a minimum deep-center concentration which allows sufficient transport (current) through the deep-center states. This minimum deep-center concentration is determined by the spatial extent of the deep-center bound-states: current through the deep-center states is dramatically larger when the deep-center spacing is comparable to the spatial extent of the deep-center bound state. This minimum deep-center concentration is about $\alpha^3/8$, where $1/\alpha$ is the radius of the spatial extent of the deep-center bound-state. Typically, one would expect to start seeing a large current through the deep-level energy-band when the concentration is greater than about $0.001\alpha^3$.

In device design or materials choice, this suggests that one choose large values of the deep-center concentration or small values of $\alpha$. Small values of $\alpha$ are possible for smaller bandgap materials (smaller $E_G$), weaker Kane matrix element (smaller P), and more shallow deep-levels (deep-level $E_d$ values away from midgap; i.e., $E_d$ closer to either 0 (the valence-band) or $E_G$ (the conduction-band)).

For light-emitters (laser diodes and light-emitting diodes), nonradiative Auger recombination should be reduced. If the optical transition is a deep-level-to-valence-band transition, one should minimize the number of conduction-band electrons: that is, make the number of conduction-band electrons a lot less than the number of electrons in the deep-level-band. To reduce the number of possible Auger transitions involving deep-level electrons, make the deep-level closer (i.e., below mid-gap) to the valence-band than to the conduction-band. To reduce the number of holes participating in Auger processes, choose an optimal hole injection concentration: that is, make the hole injection just large enough to sustain population inversion, because deep-level-to-deep-hole transitions are weak and Auger rates are large for larger hole injection. An optimal hole-quasi-Fermi-level will be determined by the amount of loss in the system; however, this optimal hole-quasi-Fermi-level will be on the order of $\hbar^2\alpha^2/2m_{eff}$ (i.e., between about 0.03 and 30 times $\hbar^2\alpha^2/2m_{eff}$) below the valence-band edge, where $m_{eff}$ is the hole (light-hole or heavy-hole) effective mass. Most likely, the optimal hole-quasi-Fermi-level will be about $\hbar^2\alpha^2/2m_{eff}$. However, if the Auger coefficients are very small, the optimal hole-quasi-Fermi-level could be much higher (deeper into the valence-band). Similarly, if the Auger coefficients are very large, the optimal hole-quasi-Fermi-level could be much lower (very shallow in the valence-band).

If the optical transition is a conduction-band-to-deep-level transition, one should minimize the number of valence-band holes: that is, make the number of valence-band holes a lot less than the number of holes in the deep-level-band. To reduce the number of possible Auger transitions involving deep-level holes, make the deep-level closer (i.e., above mid-gap) to the conduction-band than to the valence-band. (This makes the energy conservation rule of the Auger nonradiative process harder to satisfy.) To reduce the number of electrons participating in Auger processes, choose an optimal electron injection concentration: that is, make the electron injection just large enough to sustain population inversion, because deep-level-to-high-energy-electron transitions are weak and Auger rates are large for larger electron injection. An optimal electron-quasi-Fermi-level will be determined by the amount of loss in the system; however, this optimal electron-quasi-Fermi-level will be on the order of $\hbar^2\alpha^2/2m_{eff}$ (i.e., between about 0.03 and 30 times $\hbar^2\alpha^2/2m_{eff}$) above the conduction-band edge, where $m_{eff}$ is the conduction-band effective mass.

For photodetectors, the deep-level-to-conduction band transition is strongest for transitions to about $\hbar^2\alpha^2/2m_{eff}$ (i.e., between about 0.03 and 30 times $\hbar^2\alpha^2/2m_{eff}$) above the conduction-band edge, where $m_{eff}$ is the conduction-band effective mass. For photodetectors, the valence-band-to-deep-level transition is strongest for transitions from about $\hbar^2\alpha^2/2m_{eff}$ (i.e., between about 0.03 and 30 times $\hbar^2\alpha^2/2m_{eff}$) below the valence-band edge, where $m_{eff}$ is the heavy-hole effective mass.

A presently-preferred embodiment of the invention involves photodetectors and emitters in GaAs or GaP comprised of:

a top contact made from metal (e.g., Cr, Ti, Cr—Au, or Ti—Au), oxide, or semiconductor material (either doped n-type or p-type, or unintentionally-doped), having a Fermi-level within the bandgap of the optically-active semiconductor material containing the deep-levels;

Semiconductor (e.g., GaAs or GaP) with deep-levels (such as low-temperature-grown (LTG) GaAs, or GaAs doped with Cu or Cr or Fe; LTG GaAs may be additionally doped either p-type or n-type, or uid; LTG-GaAs may be grown at different growth rates and temperatures; LTG-GaAs may receive additional heat treatment);

(an optional) Semiconductor (GaAs or GaP) buffer layer (which separates the optically-active semiconductor (GaAs or GaP) with deep-levels from the bottom contact; the buffer layer may or may not be doped); and, a bottom contact (semiconductor (GaAs or GaP) doped either p-type or n-type, depending on whether the deep-level transition involves the conduction or valence band).

Deep-level engineering, as taught herein, has many useful applications in the design of semiconductor devices. Such applications may include:

Optical emitters (such laser diodes, light-emitting-diodes), including 1.3–1.55 μm wavelength devices directly on GaAs or GaP or Si, and visible wavelength (red or yellow or green) LEDs on a GaP or Si substrate;

Optical detectors (such photoconductive and photovoltaic detectors, photodiodes, avalanche photodiodes, metal-semiconductor-metal photodetectors, multiple-wavelength detectors connected in series on the same substrate, phototransistors (using deep-level optical transitions, and transistor for gain)), including 1.3–1.51 μm wavelength devices directly on GaAs or GaP or Si;

Electroabsorption modulators (devices in which electric fields modulate the absorption properties of the deep-level transitions), including 1.3–1.5 μm wavelength devices directly on GaAs or GaP or Si;

Electrorefractive modulators (devices in which electric fields modulate the refractive index of the semiconductor having deep-levels), including 1.3–1.5 µm wavelength devices directly on GaAs or GaP or Si;

Devices utilizing the nonlinear optical properties of deep-level transitions (e.g., using electric fields to change nonlinear susceptibility $\chi''$) including four-wave mixing, second-harmonic generation, heterodyne and superheterodyne detection, photorefractive effect, and saturable absorbers utilizing deep-levels;

Same as the previous six, but with multiple wavelengths (conduction-to-valence-band, deep-level-to-deep-level, deep-level-to-conduction-band, and deep-level-to-valence-band) all on the same substrate;

Tandem solar cells and tandem thermophotovoltaic (TPV) cells, where one connects in series several solar cells and/or several TPV cells of several different transition energies (conduction-to-valence-band, deep-level-to-deep-level, deep-level-to-conduction-band, and deep-level-to-valence-band), in order to maximize power conversion efficiency;

Resonant-tunneling-diodes, where tunneling occurs via the deep-level state;

Electrically and/or optically bistable devices using the negative-differential-resistance resulting from either optical transitions involving deep-levels and/or electrical transport through deep-levels or changes in optical properties resulting from an incident optical beam; Terahertz oscillators using resonant-tunneling-diodes having deep-levels; and, Transistors employing the deep-level transition as a base, emitter, or collector, or electrical contact region. (Such deep-level transitions can be used to simulate a smaller "bandgap" in the base region.)

What is claimed is:

1. A semiconductor device, comprising: a semiconductor host material, having a valence-band energy, $E_V$, a conduction-band energy, $E_C$, and an energy gap, $E_G$; a deep-level region, formed in said host material, the deep-level region having one or more deep-level state(s) with energy at least 0.05 $E_G$ above $E_V$ and at least 0.05 $E_G$ below $E_C$; and, means for injecting carriers into the deep-level region to produce transition(s) between one or more of the deep-level state(s) and the conduction- or valence-band or another deep-level of the host material.

2. A semiconductor device, as defined in claim 1, wherein the deep-level region comprises an optically-active region in which transitions between deep-level state(s) and the conduction- or valence-band or another deep-level of the host material produce or absorb photons.

3. A semiconductor device, as defined in claim 1, wherein the means for injecting carriers into the deep-level region directly injects carriers into one or more of the deep-level state(s) without having to first enter the deep-level region's conduction or valence band.

4. A semiconductor device, as defined in claim 1, wherein the host material is an elemental semiconductor.

5. A semiconductor device, as defined in claim 1, wherein the host material comprises a direct bandgap elemental semiconductor material.

6. A semiconductor device, as defined in claim 1, wherein the host material comprises an indirect bandgap elemental semiconductor material.

7. A semiconductor device, as defined in claim 1, wherein the host material is a compound semiconductor.

8. A semiconductor device, as defined in claim 1, wherein the host material comprises a direct bandgap compound semiconductor material.

9. A semiconductor device, as defined in claim 1, wherein the host material comprises an indirect bandgap compound semiconductor material.

10. A semiconductor device, as defined in claim 1, wherein the host material is an elemental semiconductor from Group IVA of the periodic table.

11. A semiconductor device, as defined in claim 1, wherein the host material is one of: C, Si, Ge, Sn, or Pb.

12. A semiconductor device, as defined in claim 1, wherein the host material comprises a direct bandgap alkali-halide compound.

13. A semiconductor device, as defined in claim 1, wherein the host material comprises an indirect bandgap alkali-halide compound.

14. A semiconductor device, as defined in claim 1, wherein the host material is an alkali-halide compound.

15. A semiconductor device, as defined in claim 1, wherein the host material is one of: LiF, LiCl, LiBr, LiI, LiAt, NaF, NaCl, NaBr, NaI, NaAt, KF, KCl, KBr, KI, or KAt.

16. A semiconductor device, as defined in claim 1, wherein the host material comprises a direct bandgap binary semiconductor compound.

17. A semiconductor device, as defined in claim 1, wherein the host material comprises an indirect bandgap binary semiconductor compound.

18. A semiconductor device, as defined in claim 1, wherein the host material is a binary compound formed from Groups IIB and VIA of the periodic table.

19. A semiconductor device, as defined in claim 1, wherein the host material is one of: ZnO, ZnS, ZnSe, ZnTe, ZnPo, CdO, CdS, CdSe, CdTe, CdPo, HgO, HgS, HgSe, HgTe, or HgPO.

20. A semiconductor device, as defined in claim 1, wherein the host material is a binary compound formed from Groups IIIA and VA of the periodic table.

* * * * *